United States Patent
Chung et al.

(10) Patent No.: US 9,287,529 B2
(45) Date of Patent: Mar. 15, 2016

(54) METHOD FOR FABRICATING OLED USING ROLL TO ROLL PROCESSING

(71) Applicant: RESEARCH & BUSINESS FOUNDATION SUNGKYUNKWAN UNIVERSITY, Suwon-si (KR)

(72) Inventors: Ho Kyoon Chung, Yongin-si (KR); Deok Su Jo, Suwon-si (KR); Bong Sung Kim, Wonju-si (KR); Sung Min Cho, Gunpo-si (KR); Min Sun Yoo, Seoul (KR)

(73) Assignee: RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 0 days.

(21) Appl. No.: 14/193,612

(22) Filed: Feb. 28, 2014

(65) Prior Publication Data
US 2014/0248726 A1   Sep. 4, 2014

Related U.S. Application Data

(63) Continuation of application No. PCT/KR2013/009837, filed on Nov. 1, 2013.

(30) Foreign Application Priority Data

Nov. 1, 2012  (KR) .................. 10-2012-0123144
Nov. 1, 2013  (KR) .................. 10-2013-0131982

(51) Int. Cl.
*H01L 51/56*  (2006.01)
*H01L 51/00*  (2006.01)

(52) U.S. Cl.
CPC ............ *H01L 51/56* (2013.01); *H01L 51/0024* (2013.01)

(58) Field of Classification Search
USPC .......................................................... 438/27
See application file for complete search history.

(56) References Cited

U.S. PATENT DOCUMENTS

2010/0084665 A1* 4/2010 Daniels et al. .................. 257/88

FOREIGN PATENT DOCUMENTS

| JP | 2006-190682 A | 7/2006 |
|---|---|---|
| JP | 2007-207633 A | 8/2007 |
| JP | 2008-204890 A | 9/2008 |
| KR | 10-2006-0024545 A | 3/2006 |
| KR | 10-2007-0033390 A | 3/2007 |
| KR | 10-0712184 B1 | 4/2007 |
| KR | 10-0745352 B1 | 8/2007 |

OTHER PUBLICATIONS

International Search Report issued Jan. 23, 2014 in counterpart Application No. PCT/KR2013/009837.

* cited by examiner

*Primary Examiner* — Alexander Ghyka
(74) *Attorney, Agent, or Firm* — NSIP Law

(57) ABSTRACT

A method for fabricating the OLED including a color conversion layer using roll-to-roll processing is provided. To elaborate, the method for fabricating an OLED comprising: bonding an OLED and an inorganic phosphor to each other through roll-to-roll processing is provided, wherein the inorganic phosphor is provided as a color conversion layer.

17 Claims, 41 Drawing Sheets

METHOD FOR FABRICATING OLED USING ROLL TO ROLL PROCESSING

CROSS-REFERENCE TO RELATED APPLICATION

This application claims the benefit of Korean Patent Application No. 10-2012-0123144 filed on Nov. 1, 2012, Korean Patent Application No. 10-2013-0131982 filed on Nov. 1, 2013 and PCT Patent Application No. PCT/KR2013/009837 filed on Nov. 1, 2013, the entire disclosures of which are incorporated herein by reference.

BACKGROUND

1. Field

The present disclosure relates to a method for fabricating an organic light emitting device (OLED) by using roll-to-roll processing.

2. Description of Related Art

As one measure to reduce discharge of greenhouse gas, there have been efforts to realize high efficiency of lighting, which occupies approximately 20% of entire energy consumption. Especially, as demands for next-generation environment-friendly lamps to replace incandescent lamps and fluorescent lamps are increasing, development of lamps using an organic light emitting diode is expanding.

Since organic light emitting devices are next-generation display devices and advantageous in that they provide a rapid response speed and high color reproducibility and can be fabricated to have very thin thickness, they have high applicability. Among those organic light emitting devices, a white organic light emitting diode is used as a light source, etc., for backlights and lamps of full color displays and liquid crystal displays.

Conventionally, in order to fabricate a display device by using an organic light emitting diode, deposition or spin coater processing was performed in the inside of a high vacuum device. Accordingly, the processing is complicated, fabricating costs are high, and due to long time for fabrication, it has been difficult to assure reliability in color conversion efficiency of a display device. Further, the conventional method for fabricating the white organic light emitting diode is disadvantageous in that due to use of multiple light emitting layers for mixture of three primary colors, the structure of the processing becomes complicated, and fabricating costs are expensive.

In this regard, Korean Patent Application Publication No. 10-2007-0033390 [Title of Invention: High Performance White Light Emitting Device (OLED)] describes a broad-band discharge OLED, which includes a first light emitting layer provided on an anode and containing a first host material and a first light emitting material, wherein the first host material is a mixture of at least one mono-anthracene derivative and at least one aromatic amine derivative, the mono-anthracene derivative is provided in a volume fraction range of from 5% to 50% based on an entire host volume, and the aromatic amine derivative is provided in a volume fraction range of from 50% to 95% based on the entire host volume, and a second light emitting layer provided above or below the first light emitting layer.

In order to resolve the foregoing conventional problems, the present disclosure provides a method for fabricating an OLED including a color conversion layer. However, the problems sought to be solved by the present disclosure are not limited to those described above, and there may be other problems, which are sought to be solved by the present disclosure.

SUMMARY

In view of the foregoing, example embodiments provide a method for fabricating the OLED including a color conversion layer using roll-to-roll processing.

However, the problems sought to be solved by the present disclosure are not limited to the above description and other problems can be clearly understood by those skilled in the art from the following description.

In accordance with a first aspect of the present disclosure, there is provided a method for fabricating an organic light emitting device (OLED), comprising: bonding an OLED and an inorganic phosphor to each other through roll-to-roll processing, wherein the inorganic phosphor is provided as a color conversion layer.

According to one of the foregoing technical means of the present disclosure, it is possible to easily realize an OLED including an inorganic phosphor serving as a color conversion layer, by bonding the OLED in a particular color and the inorganic phosphor through roll-to-roll processing.

In addition, according to one of the technical means of the present disclosure, since the inorganic phosphor and the OLED are bonded to each other through the roll-to-roll processing, fabrication time and influence from external factors such as water, heat, impurities are reduced so that the reliability can be improved.

In addition, according to one of the technical means of the present disclosure, there is an effect on large-area bonding at the time of bonding the OLED and the inorganic phosphor by using an inorganic phosphor having a zero (0)-dimensional particle characteristic, which can be applied to the roll-to-roll processing.

BRIEF DESCRIPTION OF THE DRAWINGS

Non-limiting and non-exhaustive embodiments of the present disclosure will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION

Figure 1:
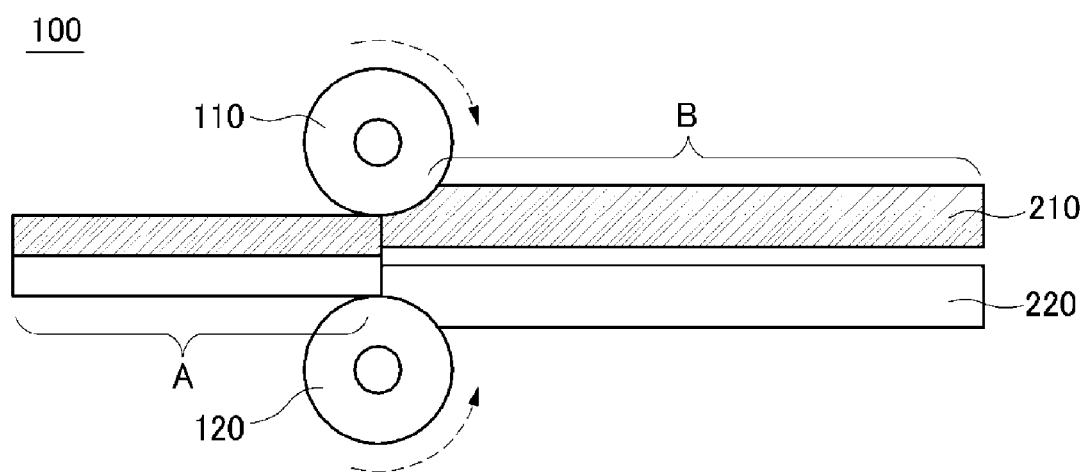
FIG. 1 is a schematic view showing a method for fabricating an OLED including a color conversion layer in accordance with an illustrative embodiment of the present disclosure.

Hereinafter, illustrative embodiments of the present disclosure will be described in detail with reference to the accompanying drawings so that inventive concept may be readily implemented by those skilled in the art. However, it is to be noted that the present disclosure is not limited to the illustrative embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element.

Through the whole document, the term "on" that is used to designate a position of one element with respect to another element includes both a case that the one element is adjacent to the another element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

FIG. 1 is a schematic view showing a method for fabricating an OLED including a color conversion layer in accordance with an illustrative embodiment of the present disclosure.

FIG. 1 schematically illustrates roll-to-roll facility for fabricating an OLED in accordance with an illustrative embodiment of the present disclosure. Although FIG. 1 illustrates a side view of a pair of rollers 110 and 120, among the elements of the roll-to-roll facility 100, the roll-to-roll facility 100 may be configured with multiple pairs of rollers in accordance with another illustrative embodiment of the present disclosure.

In an illustrative embodiment of the present disclosure, the "roll-to-roll" means a processing technique for an OLED. In the "roll-to-roll" processing, an OLED itself or an OLED substrate may be used as a vessel, and a certain structure (a color conversion layer, a bonding layer, a protection layer, a light scattering layer, a lens layer, a patterning layer, a polarizing layer, a plasmon layer, an electron injection layer, an electron transfer layer, a light emitting layer, a hole injection layer, a hole transfer layer, an electrode layer, a transistor layer, a pore layer, an environment blocker, an environment preserving agent, etc.) may be bonded to the OLED through at least one roller or "rolling processing".

In an illustrative embodiment of the present disclosure, the "vessel" may have flexibility and be mounted as a "roll" in the roll-to-roll processing. In addition, the vessel may contain the certain structures or combinations thereof.

In an illustrative embodiment of the present disclosure, the "bonding" means independent, continuous and direct bonding between the certain structures on the OLED substrate and the OLED. That is, the certain structures and combinations thereof may be "bonded".

In an illustrative embodiment of the present disclosure, the "bonding material" may basically have flexibility and penetrability and may be used for bonding between the vessel and a certain structure layer or bonding between a phosphor layer and a certain structure layer in the roll-to-roll processing.

As illustrated in FIG. 1, of two rollers 110 and 120, the first roller 110 is placed to be in contact with a top portion of a first base material 210, and the second roller 120 is placed to be in contact with a bottom portion of a second base material 220. Thereafter, the first and second rollers 110 and 120 are rolled in the direction of the arrow to pressurize/heat the first and second base materials 210 and 220. As a result, the first and second base materials 210 and 220 are bonded to each other.

FIG. 1 illustrates a process for bonding the first and second base materials 210 and 220 to each other by rolling the first and second rollers 110 and 120. The "A" portion corresponds to the state that the first and second base materials 210 and 220 are bonded to each other by the rolling of the first and second rollers 110 and 120. The "B" portion corresponds to the state before the first and second base materials 210 and 220 are bonded to each other by the rolling of the first and second rollers 110 and 120.

In an illustrative embodiment of the present disclosure, each of the first and second base materials 210 and 220 is one of an OLED and an inorganic phosphor, wherein the first and second base materials are different from each other. That is, it is possible to realize a hybrid organic light emitting device (i.e., the "A" portion in FIG. 1), in which an OLED and an inorganic phosphor are bonded to each other through the roll-to-roll processing, and the inorganic phosphor serves as a color conversion layer.

The inorganic phosphor in accordance with an illustrative embodiment of the present disclosure may be a base material having a zero (0)-dimensional particle characteristic. This inorganic phosphor may be prepared in the state that an adhesive is applied to the vessel containing inorganic phosphor powders.

The material for the inorganic phosphor having the zero (0)-dimensional particle characteristic may be powders of an inorganic phosphor and a quantum dot. Since the material for the inorganic phosphor has the fine particle powder form, it is advantageous in solidification, liquefaction and vaporization and may be used for an ordinary static substrate or a flexible substrate. In addition, the vessel containing the inorganic phosphor powders may be an ultra-thin vessel and configured to enable the inorganic phosphor to be placed on the substrate in various manners.

The inorganic phosphor may be produced in a form suitable for the roll-to-roll processing. For example, the inorganic phosphor may be produced in the form of ultra-thin transparent plastic like a film or ultra-thin glass. For reference, the inorganic phosphor may be prepared in the state of being wound around the first or second rollers 110 or 120 (i.e., an ultra-thin transparent plastic base material). In this case, the inorganic phosphor may be bonded to the OLED while being contacted with one surface of the OLED in the rolling direction through rolling of the two rollers 110 and 120.

As described above, by bonding the OLED and the inorganic phosphor to each other, it is possible to convert the OLED in a specific color (e.g., blue OLED) into an OLED in various colors (e.g., white OLED, red OLED, green OLED, etc.) depending on a particle size and a structural characteristic of the inorganic phosphor. In addition, luminance of the OLED can be improved depending on variation of efficiency of light extraction by the inorganic phosphor.

Meanwhile, bonding the OLED and the inorganic phosphor to each other by using the pair of the rollers 110 and 120 in the roll-to-roll facility 100 in accordance with an illustrative embodiment of the present disclosure has been described. However, as shown in FIGS. 2A and 2B, the OLED may be fabricated by using a single roller 110 in an OLED fabrication method in accordance with another illustrative embodiment of the present disclosure.

Figure 2A:
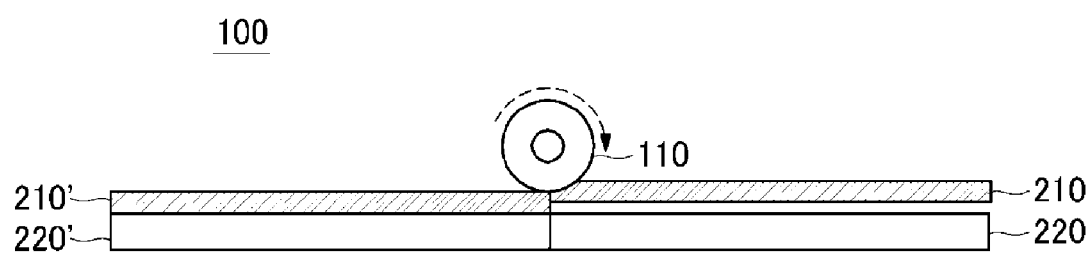
FIGS. 2A and 2B illustrate a roll-to-roll facility for fabrication of an OLED in accordance with another illustrative embodiment of the present disclosure.
Figure 2B:
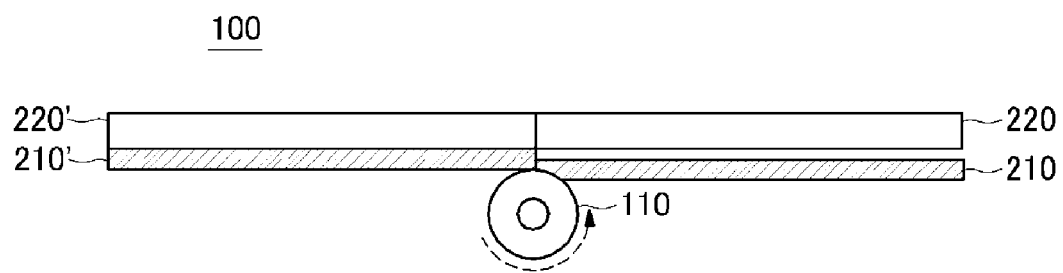

FIGS. 2A and 2B illustrate a roll-to-roll facility for fabricating an OLED in accordance with an illustrative embodiment of the present disclosure.

FIG. 2A illustrates a method for fabricating a top emission OLED by using the single roller 110, and FIG. 2B illustrates a method for fabricating a bottom emission OLED. The OLED fabricating methods that bond the top emission OLED or the bottom emission OLED to the inorganic phosphor are described in detail below with reference to FIGS. 3 and 4.

In FIGS. 2A and 2B, the OLED and the inorganic phosphor that have been bonded to each other through rolling are referred to as the OLED 220' and the inorganic phosphor 210', respectively, and the OLED and the inorganic phosphor before the bonding are referred to as the OLED 220 and the inorganic phosphor 210, respectively.

Figure 3:
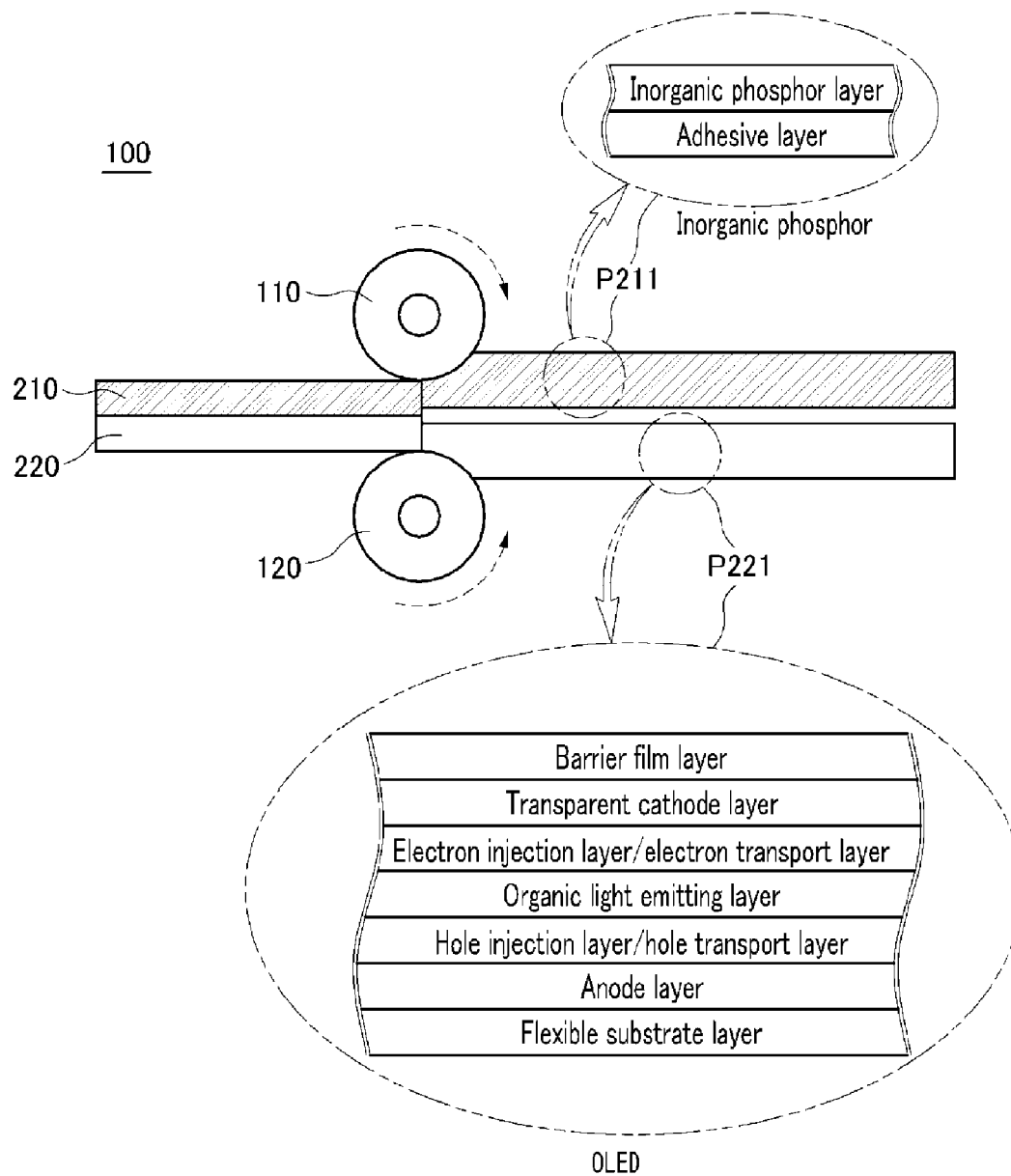
FIG. 3 is a schematic view showing a method for fabricating a top emission OLED including a color conversion layer in accordance with an illustrative embodiment of the present disclosure.

FIG. 3 is a schematic view showing a method for fabricating a top emission OLED including a color conversion layer in accordance with an illustrative embodiment of the present disclosure.

The first base material 210 illustrated in FIG. 3 is the inorganic phosphor, and the second base material 220 is the top emission OLED.

As shown from the enlarged view P211 of a partial cross section of the first base material 210, the first base material 210 has a structure, in which an inorganic phosphor layer and an adhesive layer are staked. In addition, as shown from the enlarged view P221 of a partial cross section of the second base material 220, the second base material 220 has a structure, in which a barrier film layer, a cathode layer, an electron injection layer (EIL)/an electron transport layer (ETL), an organic light emitting layer, a hole injection layer (HIL)/a hole transport layer (HTL), an anode layer and a flexible substrate layer are stacked.

In this case, the top emission OLED is configured with a penetrative cathode layer (e.g., a transparent or semi-transparent cathode layer) and a reflective anode layer. By contacting the adhesive layer of the inorganic phosphor on the cathode layer of the top emission OLED and bonding them to each other through the roll-to-roll processing, it is possible to realize the top emission OLED including a color conversion layer.

Figure 4:
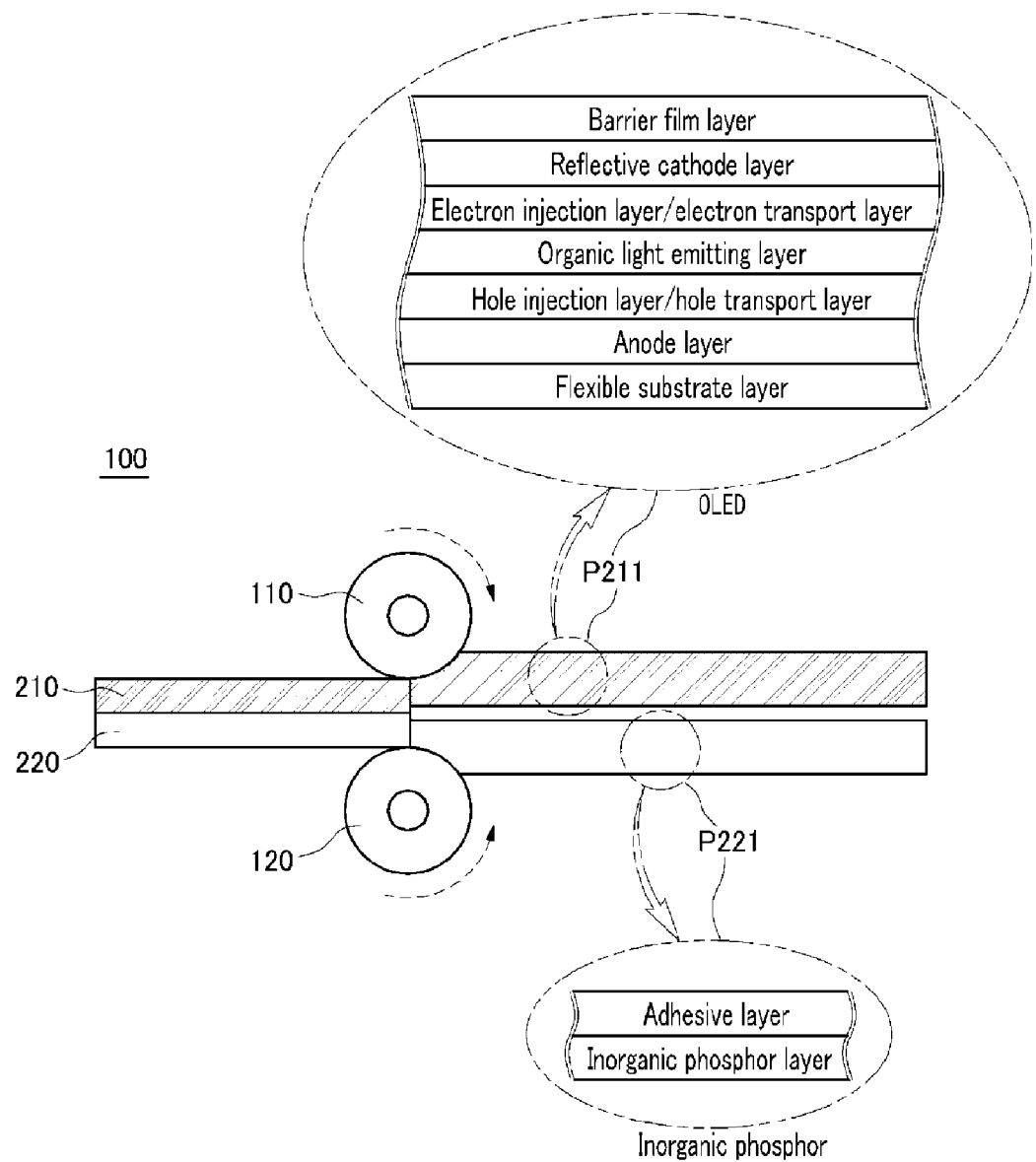
FIG. 4 is a schematic view showing a method for fabricating a bottom emission OLED including a color conversion layer in accordance with an illustrative embodiment of the present disclosure.

FIG. 4 is a schematic view showing a method for fabricating a bottom emission OLED including a color conversion layer in accordance with an illustrative embodiment of the present disclosure.

The first base material 210 illustrated in FIG. 4 is the top emission OLED, and the second base material 220 is the inorganic phosphor.

As shown from the enlarged view P211 of a partial cross section of the first base material 210 in FIG. 4, the first base material 210 has a structure, in which a barrier film layer, a cathode layer, an electron injection layer/an electron transport layer, an organic light emitting layer, a hole injection layer/a hole transport layer, an anode layer and a flexible substrate layer are stacked. In this case, the top emission OLED is configured with a reflective cathode layer and a penetrative anode layer. In addition, as shown from the enlarged view P221 of a partial cross section of the second base material 220 in FIG. 4, the second base material 220 has a structure, in which an adhesive layer and an inorganic phosphor layer are stacked. By contacting the adhesive layer of the inorganic phosphor on the anode layer of the top emission OLED and bonding them to each other through the roll-to-roll processing, it is possible to realize the bottom emission OLED including a color conversion layer.

For convenience in description, FIGS. 3 and 4 illustrate that the inorganic phosphors are placed on the top portion of the top emission OLED and the bottom portion of the bottom emission OLED and bonded thereto through the roll-to-roll processing. However, the stacking sequence and the direction of the first base material 210 and the second base material 220 may be modified such that the adhesive layer of the inorganic phosphor is in contact with a side of the cathode layer of the stacking structure of the top emission OLED and a side of the anode layer of the stacking structure of the bottom emission OLED.

Hereinafter, the method for fabricating an OLED in accordance with an illustrative embodiment of the present disclosure is described with reference to FIG. 5.

Figure 5:
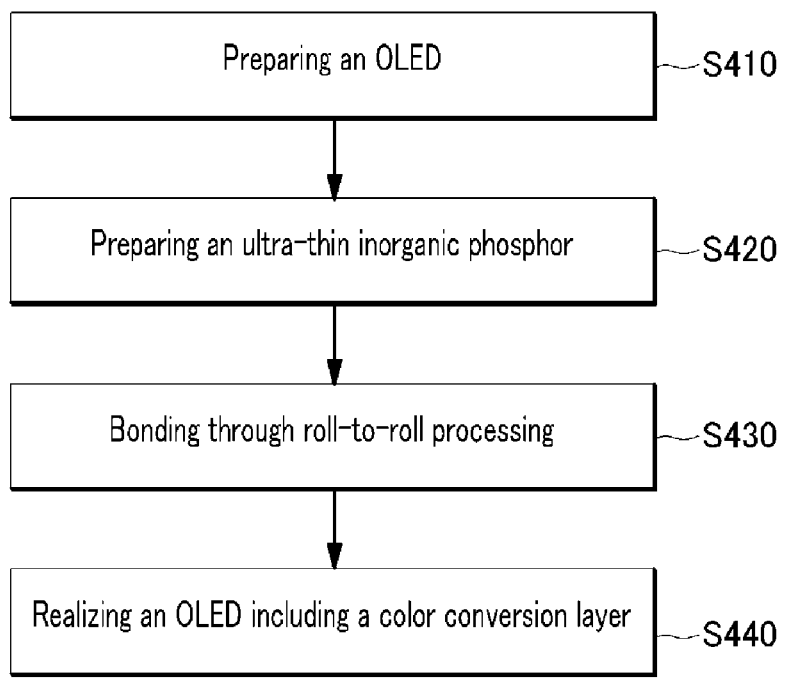
FIG. 5 is a flow chart showing a method for fabricating an OLED in accordance with an illustrative embodiment of the present disclosure.

FIG. 5 is a flow chart showing a method for fabricating an OLED in accordance with an illustrative embodiment of the present disclosure.

First, an OLED produced in the form, to which the roll-to-roll processing can be applied, is prepared (S410).

In addition, an ultra-thin inorganic phosphor in the form, to which the roll-to-roll processing can be applied, is prepared such that at least one surface of the ultra-thin inorganic phosphor is in contact with the OLED (S420).

Next, the prepared OLED and the prepared inorganic phosphor are pressurized/heated through the roll-to-roll processing so as to be bonded to each other (S430).

Through the above-described processing, an OLED including a color conversion layer (i.e., the inorganic phosphor) is obtained (S440).

Meanwhile, in a method for fabricating an OLED by using the roll-to-roll facility 100 in accordance with another illustrative embodiment of the present disclosure, multiple phosphor layers (e.g., double phosphor layers) as well as a single phosphor layer may be added or multiply stacked.

FIGS. 6A to 8B are schematic views illustrating methods for fabricating an OLED including a color conversion layer in accordance with illustrative embodiments of the present disclosure.

Figure 6A:
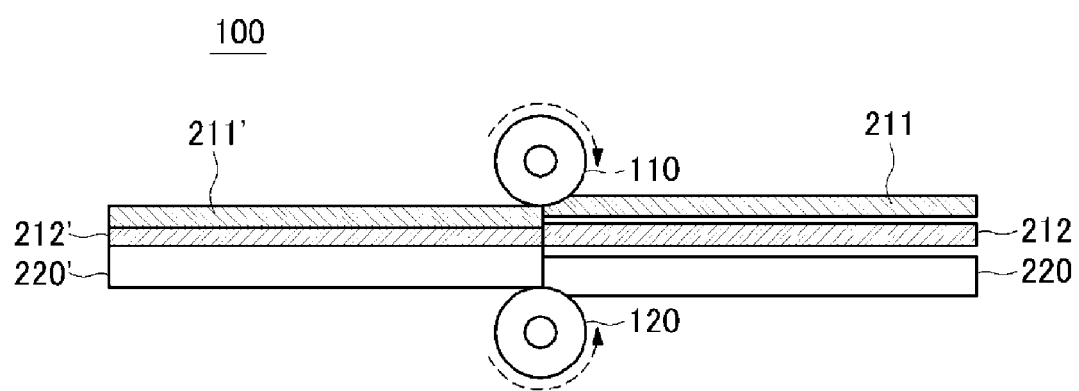
FIGS. 6A and 6B are schematic views showing a method for fabricating an OLED including a color conversion layer in accordance with an illustrative embodiment of the present disclosure.
Figure 6B:
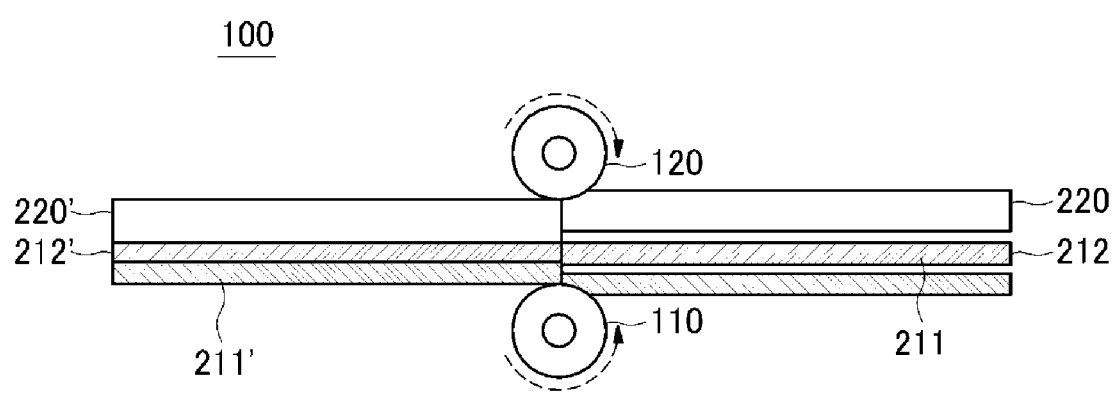

In a method for fabricating an OLED in accordance with another illustrative embodiment of the present disclosure as illustrated in FIGS. 6A and 6B, the OLED fabrication is implemented through the processes set forth below.

First, two phosphor layers 211 and 212 and an OLED layer 220 are prepared on the roll-to-roll facility 100. In this case, the phosphor layers and the OLED layer are supplemented, distributed and transported by the rollers, and this preparation process may require a process for including an adhesive or a bond on the phosphor layers and the OLED layer. For reference, FIG. 6A illustrates a method for fabricating the top emission OLED, and FIG. 6B illustrates a method for fabricating the bottom emission OLED.

Next, the two phosphor layers 211 and 212 and the OLED layer pass through the pair of the rollers 110 and 120 so as to be bonded to each other. In this case, the bonding may be implemented by applying pressure and heat to the pair of the rollers 110 and 120.

As a result, the OLED 220' bonded to the two phosphor layers 211' and 212' is obtained. Like this, the process for obtaining the OLED bonded to the two phosphor layers may mean a final process or an intermediate completion process of the processing, and the obtained OLED is prepared on the rollers.

Figure 7A:
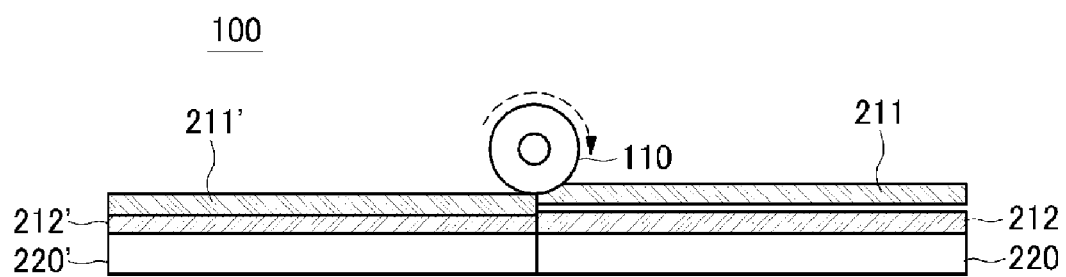
FIGS. 7A and 7B are schematic views showing a method for fabricating an OLED including a color conversion layer in accordance with another illustrative embodiment of the present disclosure.
Figure 7B:
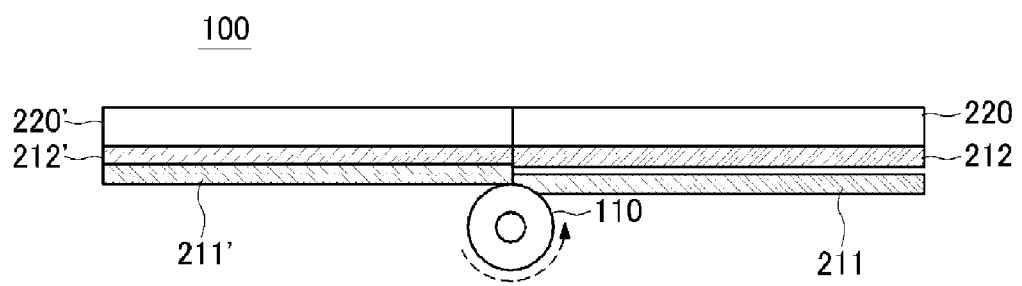

FIGS. 7A and 7B illustrate fabricating an OLED by using a single roller 110 in the OLED fabrication method described in FIGS. 6A and 6B, while bonding the second phosphor layer 211 by using the single roller 110 in the state that the OLED layer 220 and the first phosphor layer 212 are bonded to each other.

Figure 8A:
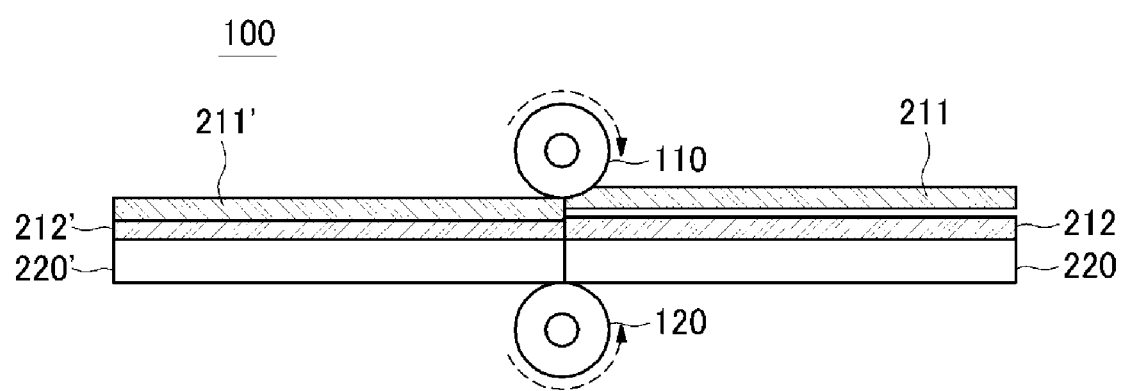
FIGS. 8A and 8B are schematic views showing a method for fabricating an OLED including a color conversion layer in accordance with another illustrative embodiment of the present disclosure.
Figure 8B:
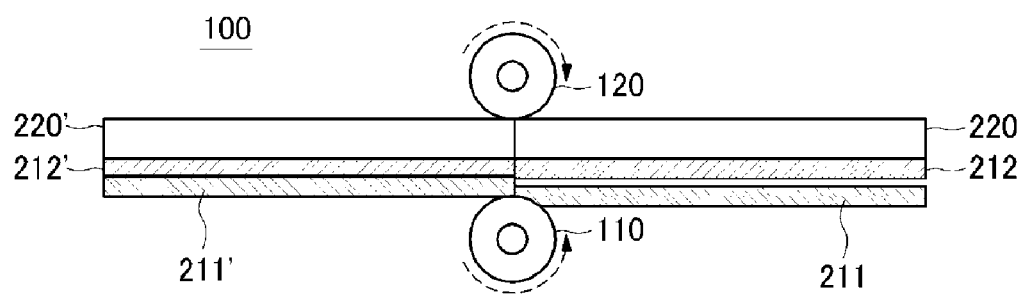

In addition, FIGS. 8A and 8B illustrate fabricating an OLED by using double rollers 110 and 120, while bonding the second phosphor layer 211 by using the double rollers 110 and 120 in the state that the OLED layer 220 and the first phosphor layer 212 are bonded to each other.

Bonding the non-patterned phosphor layer to the OLED layer through the OLED fabrication method in accordance with an illustrative embodiment of the present disclosure has been described.

Meanwhile, in an OLED fabrication method in accordance with another illustrative embodiment of the present disclosure, patterning may be implemented by selectively stacking phosphor blocks and bonding them to one another.

Figure 9A:
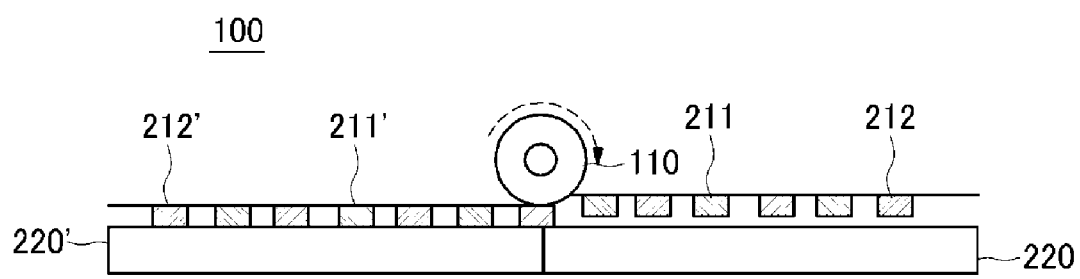
FIGS. 9A and 9B are schematic views showing a method for fabricating an OLED including a color conversion layer in accordance with another illustrative embodiment of the present disclosure.
Figure 9B:
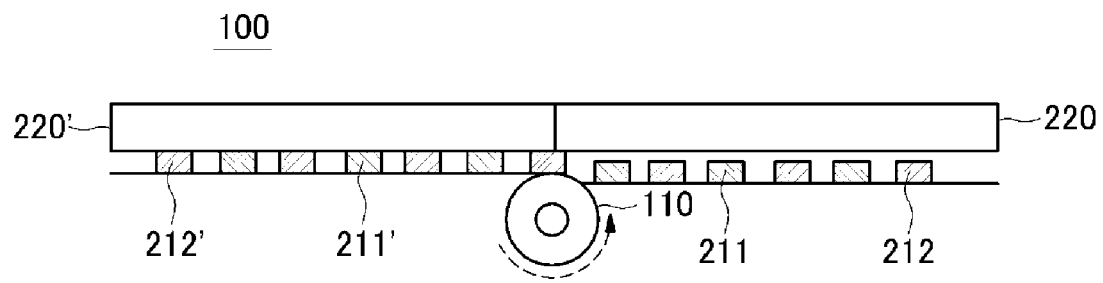
Figure 10A:
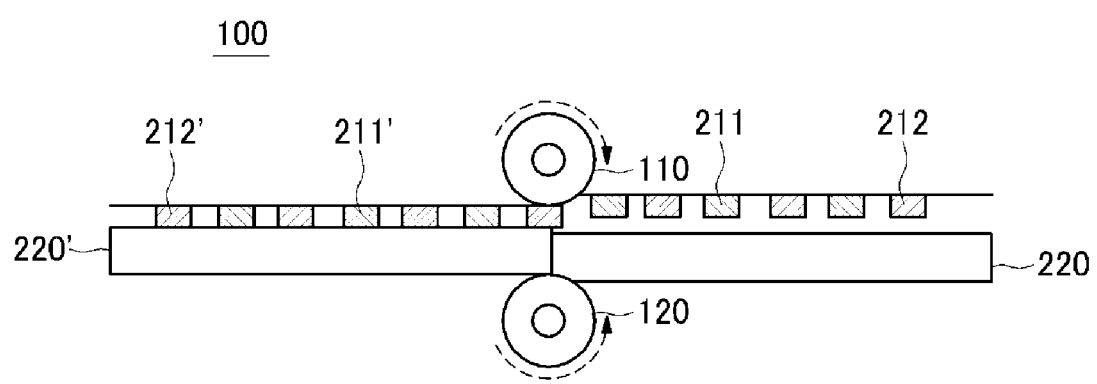
FIGS. 10A and 10B are schematic views showing a method for fabricating an OLED including a color conversion layer in accordance with another illustrative embodiment of the present disclosure.
Figure 10B:
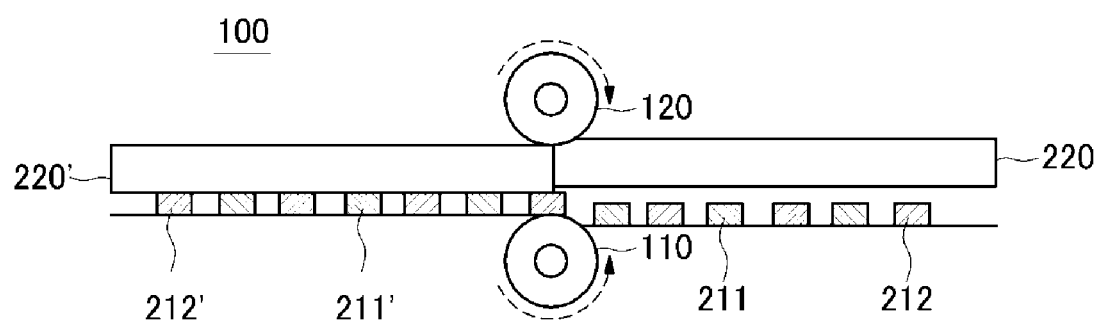

FIGS. 9A and 9B are schematic views showing a method for fabricating an OLED including a color conversion layer in accordance with an illustrative embodiment of the present disclosure. FIGS. 10A and 10B are schematic views showing a method for fabricating an OLED including a color conversion layer in accordance with another illustrative embodiment of the present disclosure.

In an OLED fabrication method in accordance with an embodiment of the present disclosure as illustrated in FIGS. 9A and 9B, the OLED fabrication is implemented through the processes set forth below.

First, different phosphor block layers 211 and 212 and an OLED layer 220 are prepared on the roll-to-roll facility 100. In this case, the phosphor block layers and the OLED layer are supplemented, distributed and transported by the roller 110, and the different phosphor block layers may be diverse in length. This preparation process may require a process for including an adhesive or a bond on the phosphor layers and the OLED layer. For reference, FIG. 9A illustrates a method for fabricating the top emission OLED, and FIG. 9B illustrates a method for fabricating the bottom emission OLED.

Next, the different phosphor block layers 211 and 212 and the OLED layer 220 pass through the single roller 110 so as to be bonded to each other. In this case, the bonding may be implemented by applying pressure and heat to the single roller 110.

As a result, the OLED 220' bonded to the different phosphor block layers 211' and 212' is obtained. Like this, the process for obtaining the OLED bonded to the different phosphor block layers may mean a final process or an intermediate completion process of the processing, and the obtained OLED is prepared on the roller.

FIGS. 10A and 10B illustrate bonding the different phosphor block layers 211 and 212 to the OLED layer 220 by using a pair of rollers 110 and 120 in the OLED fabrication method described in FIGS. 9A and 9B.

Hereinafter, the roll-to-roll facility 100 that performs a rolling function for coating and micro-lens arrangement, as well as the rolling function for bonding the phosphor layer and the OLED layer is described.

Figure 11:
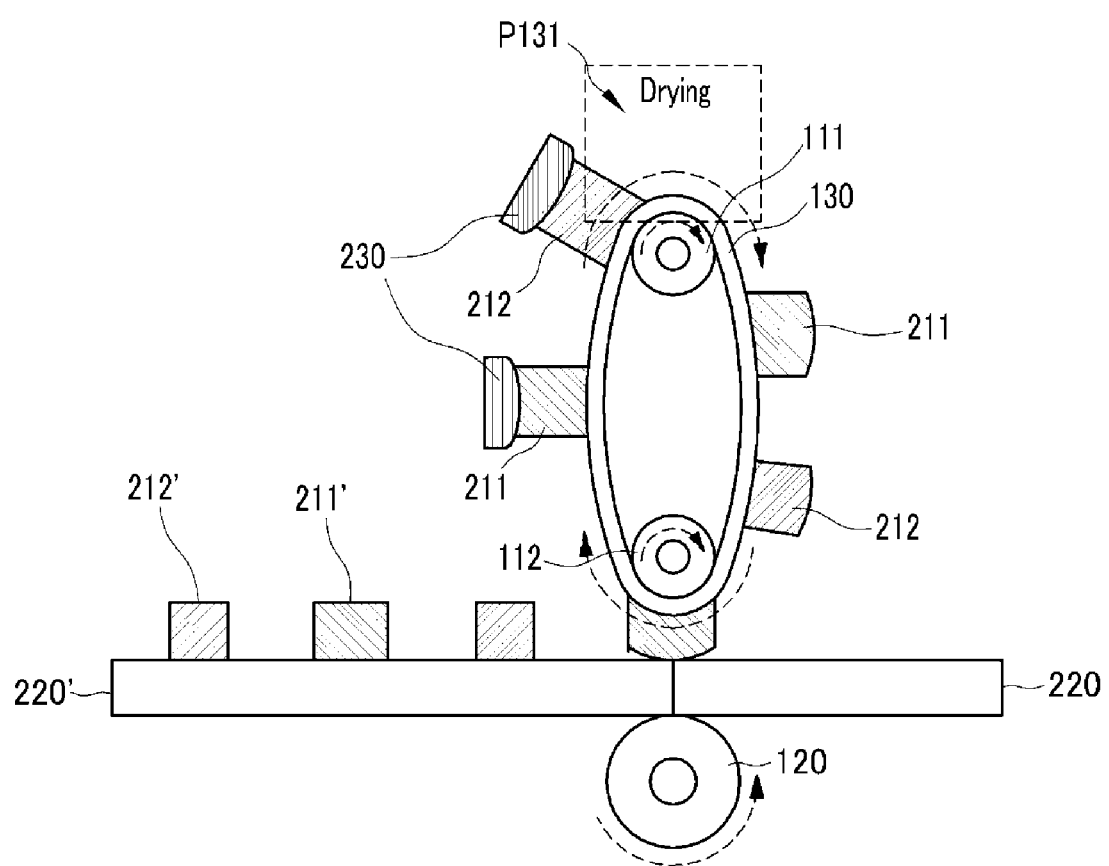
FIGS. 11 and 12 show a method for supplying a phosphor block layer on a roll in accordance with an illustrative embodiment of the present disclosure.
Figure 12:
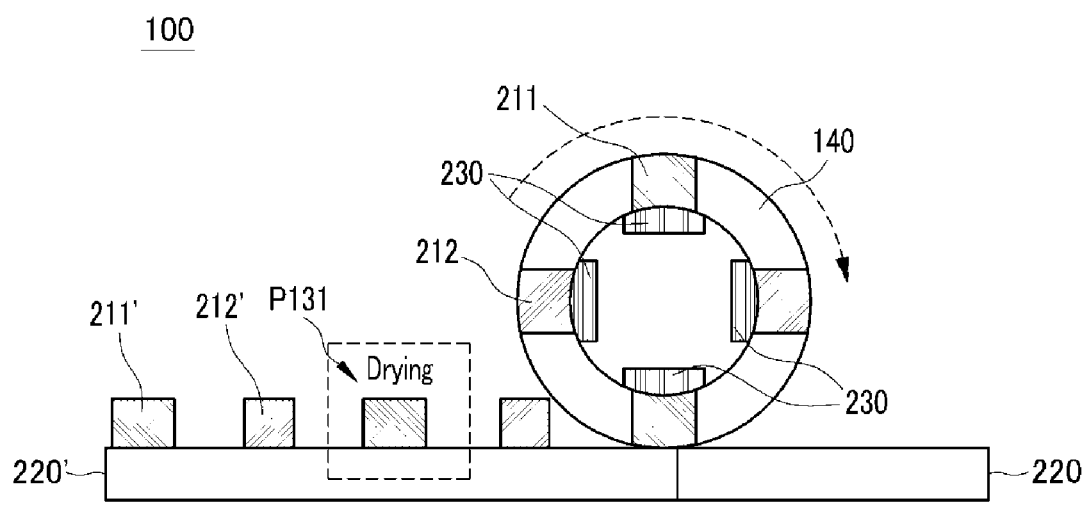

FIGS. 11 and 12 show a method for supplying and fabricating a phosphor block layer on a roll in accordance with an illustrative embodiment of the present disclosure.

In the roll-to-roll processing in accordance with an illustrative embodiment of the present disclosure as illustrated in FIG. 11, the phosphor block layers 211 and 212 are supplied on the roll through the processes set forth below.

First, at least one phosphor block layer precursor is supplied on a roll 130 containing a release agent through nozzles 230, and then, dried P131 so as to form phosphor block layers 211 and 212. At this time, the roll 130 is rolled by a pair of rollers 111 and 112 such that each of the phosphor block layers 211 and 212 is supplemented, distributed and transported. At the time of the distribution of the phosphor block layers, length of the block layers may be uniformly or continuously adjusted. This process may require a process for including an adhesive or a bond on the phosphor block layers and the OLED layer. In addition, the process may be applied for fabrication of each of the top emission OLED and the bottom emission OLED.

Next, the phosphor block layers 212 and 211 transported by the pair of the rollers 111 and 112 are repeatedly supplied on the OLED layer 220 supplied on the roller 120, and pressure and heat are applied thereto through the pair of the rollers 120 and 112 so that the phosphor block layers 212 and 211 are bonded onto the OLED layer 220. As a result, the OLED 220', to which the phosphor block layers 211' and 212' are bonded, is obtained. The process for obtaining the OLED 220' may mean a final process or an intermediate completion process of the processing, and the obtained OLED is prepared on the roller.

In roll-to-roll processing in accordance with another illustrative embodiment of the present disclosure as illustrated in FIG. 12, the phosphor block layers 211 and 212 are supplied on the roll through the processes set forth below.

First, a phosphor block layer precursor is supplied on the OLED layer 220 through nozzles 230 mounted on the roller 140 itself, and then, dried P131 so as to form the phosphor block layers 211 and 212. In this case, the phosphor block layers 211 and 212 and the OLED layer 220 are supplemented, distributed and transported by the single roller 140. This process may require a process for including an adhesive or a bond on the phosphor block layers and the OLED layer and may be applied for fabrication of each of the top emission OLED and the bottom emission OLED.

These phosphor block layers 211 and 212 are repeatedly supplied on the roll configured with the OLED layer 220, and pressure and heat are applied to the phosphor block layers 211 and 212 through the roller 140 so that the phosphor block layers 211 and 212 and the OLED layer 220 are bonded to each other. As a result, the OLED 220', to which the phosphor block layers 211' and 212' are bonded, is obtained.

Meanwhile, in another OLED fabrication method of the present disclosure, a blade may be used together with a roller.

FIGS. 13A to 19B illustrate methods for fabricating an OLED in accordance with illustrative embodiments of the present disclosure.

Figure 13A:
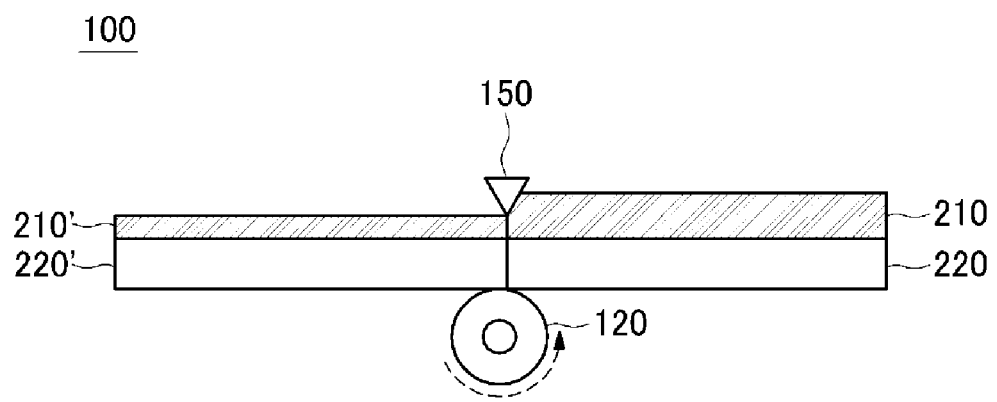
FIGS. 13A and 13B show a method for fabricating an OLED in accordance with another illustrative embodiment of the present disclosure.
Figure 13B:
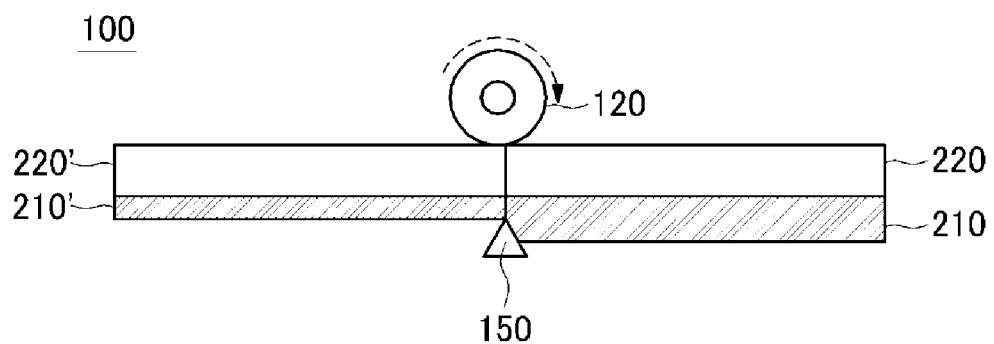

FIGS. 13A and 13B illustrate roll-to-roll processing, which cuts an OLED, to which a single phosphor layer is bonded, by using one roller 120 and a blade 150.

In the roll-to-roll processing in accordance with an embodiment of the present disclosure as illustrated in FIGS. 13A and 13B, the OLED 220, to which the phosphor layer 210 is bonded, is cut, and thickness thereof is adjusted in the manner set forth below.

First, an OLED 220', in which the phosphor layer 210 and the OLED layer 220 are bonded to each other through the roll-to-roll processing, is obtained. At this time, the bonding is implemented by applying pressure and heat through one roller 120. FIGS. 13A and 13B show the top emission OLED and the bottom emission OLED, respectively.

Upon the roll-to-roll processing illustrated in FIGS. 13A and 13B, the phosphor layer 210 and the OLED layer 220 are bonded to each other by the roller 120 positioned on the OLED layer 220 and the blade 150 positioned on the phosphor layer 110, and the phosphor layer 210 is cut by the blade 150 to adjust thickness thereof. As a result, the OLED 220', to which the cut phosphor layer 210' is bonded, is obtained. The process for obtaining the OLED 220' may mean a final process or an intermediate completion process of the processing, and the obtained OLED 220' is prepared on the roller.

Since the blade 150 in accordance with an illustrative embodiment of the present disclosure is adjustable in height and may be configured to be of various shapes, it is possible to form a patterned phosphor layer.

Figure 14A:
FIGS. 14A, 14B and 14C show a method for fabricating an OLED in accordance with another illustrative embodiment of the present disclosure.
Figure 14B:
Figure 14C:
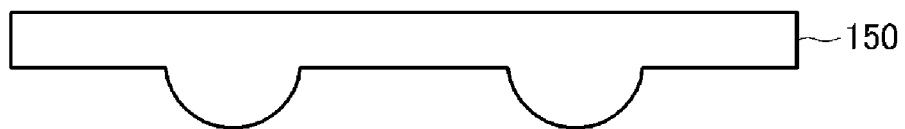

FIGS. 14A to 14C show various examples for the blade. Such a blade in various shapes may be also applied to the roll-to-roll processing illustrated in FIGS. 15 to 19, which are set forth below.

Figure 15A:
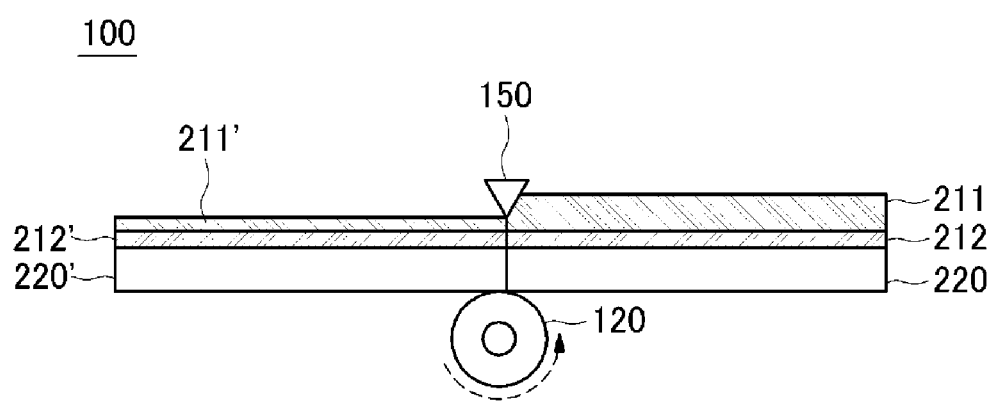
FIGS. 15A and 15B show a method for fabricating an OLED in accordance with another illustrative embodiment of the present disclosure.
Figure 15B:
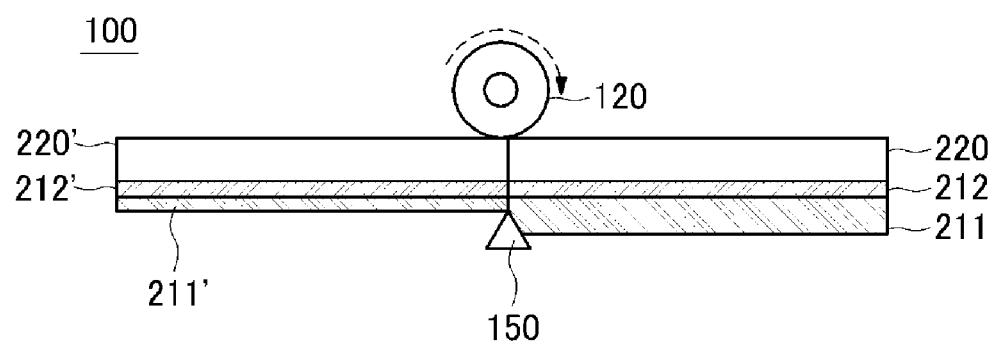

FIGS. 15A and 15B illustrate roll-to-roll processing, which bonds multiple phosphor layers 211 and 212 and the OLED layer 220 to each other through one roller 120, while cutting one phosphor layer 211 by using the blade 150 and adjusting thickness thereof so as to obtain the OLED 220', to which the phosphor layers 211' and 212' are bonded.

FIGS. 13A, 13B, 15A and 15B illustrate roll-to-roll processing, which implements the bonding in the manner that one roller 120 applies pressure and heat from the side of the OLED layer.

Figure 16A:
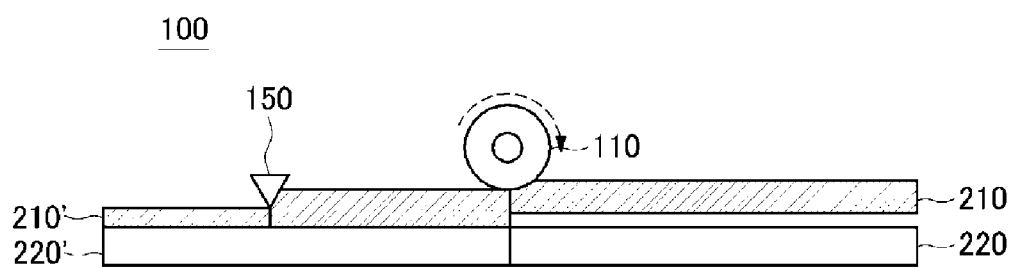
FIGS. 16A and 16B show a method for fabricating an OLED in accordance with another illustrative embodiment of the present disclosure.
Figure 16B:
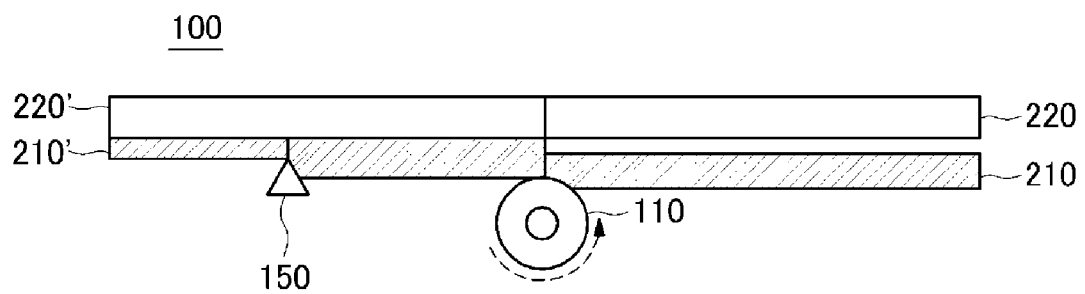

Meanwhile, FIGS. 16A and 16B illustrate roll-to-roll processing, which implements the bonding in the manner that one roller 110 applies pressure and heat from the side of the phosphor layer 210, while cutting the phosphor layer 210 and adjusting thickness thereof by using the blade 150.

Figure 17A:
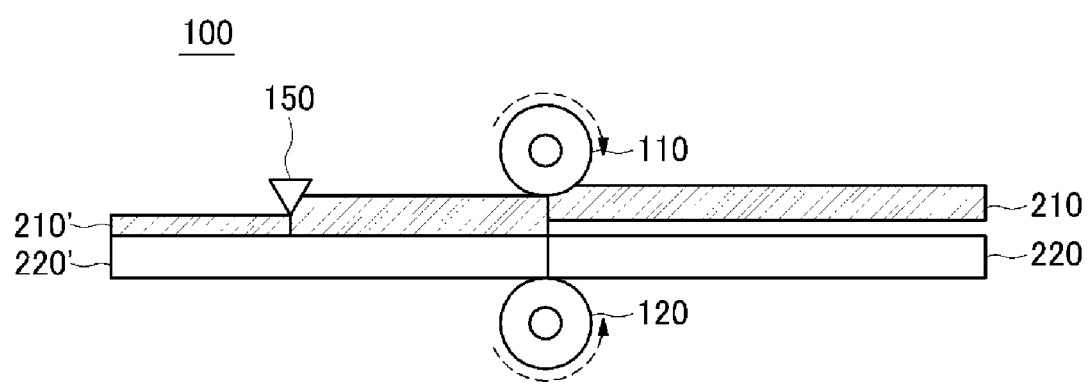
FIGS. 17A and 17B show a method for fabricating an OLED in accordance with another illustrative embodiment of the present disclosure.
Figure 17B:
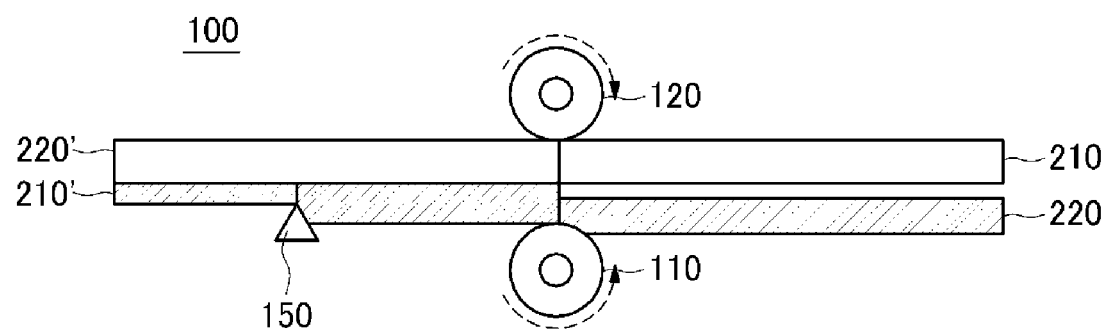

FIGS. 17A and 17B illustrate roll-to-roll processing, which bonds the phosphor layer 210 and the OLED layer 210 to each other by applying pressure and heat through the double rollers 110 and 120, while cutting the phosphor layer 220 and adjusting thickness thereof by using the blade 150.

Figure 18A:
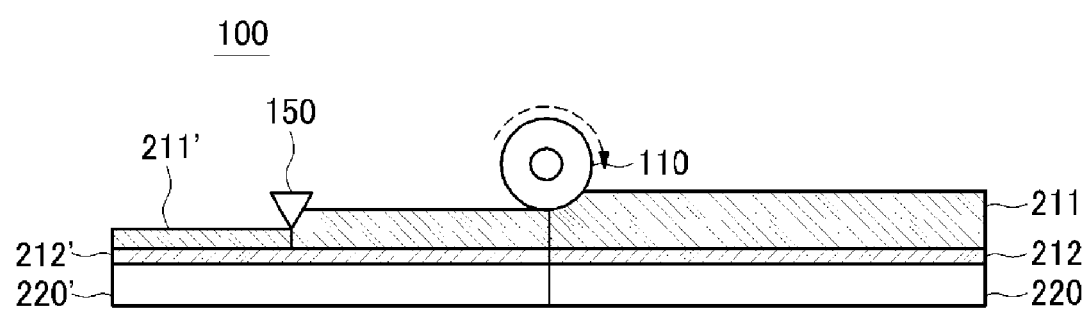
FIGS. 18A and 18B show a method for fabricating an OLED in accordance with another illustrative embodiment of the present disclosure.
Figure 18B:
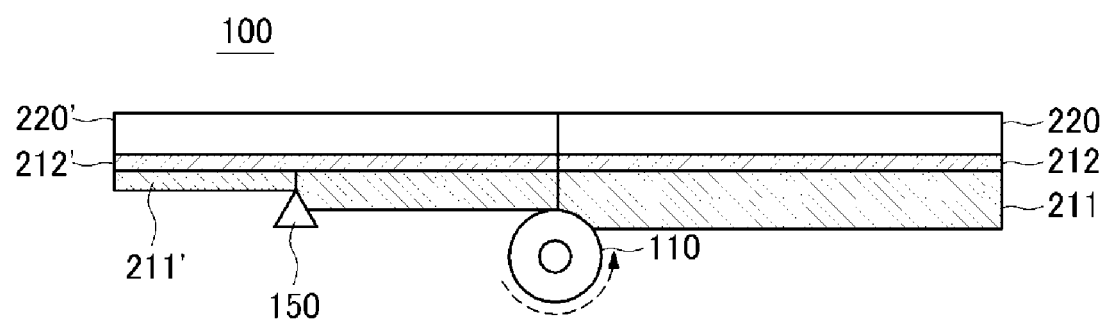

FIGS. 18A and 18B illustrate roll-to-roll processing, which bonds the double phosphor layers 211 and 212 and the OLED layer 220 by using one roller 110, while cutting the first phosphor layer 211 and adjusting thickness thereof by using the blade 150. FIG. 18 shows that one roller 110 and the blade 150 implement their respective performances on the side of the first phosphor layer 211.

Meanwhile, since the processing, which bonds the single phosphor layer or the double phosphor layers and the OLED layer through one roller or double rollers, and the processing, which cuts the phosphor layer by using the blade 150, as illustrated in FIGS. 16A to 18B correspond to the processes of the roll-to-roll processing methods illustrated in FIGS. 13A to 15B, respectively, detailed description in this regard is omitted.

Figure 19A:
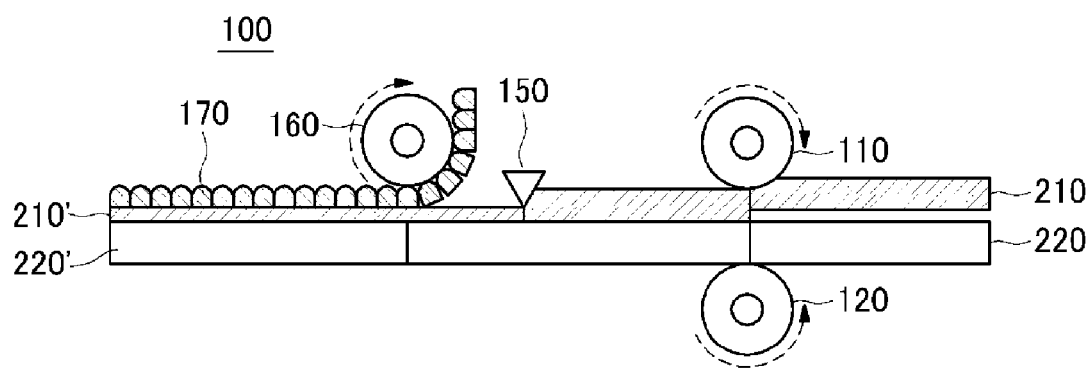
FIGS. 19A and 19B show a method for fabricating an OLED in accordance with another illustrative embodiment of the present disclosure.
Figure 19B:
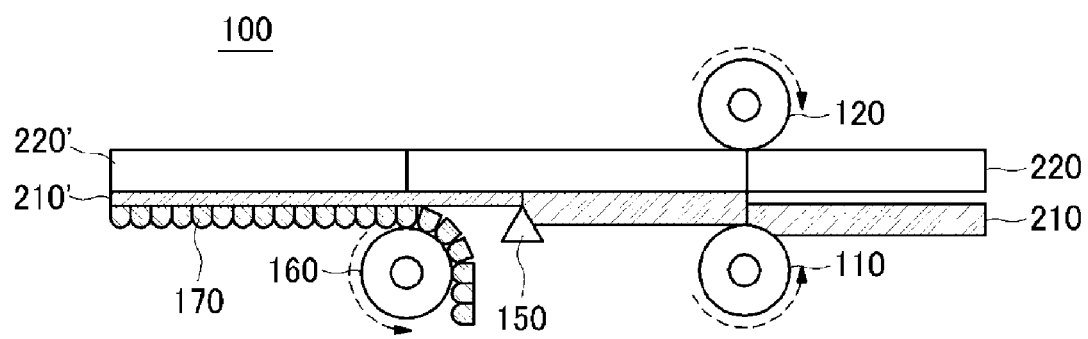

FIGS. 19A and 19B illustrate a process, in which the adjustment of the thickness and the formation of the shape of the phosphor layer are implemented through the blade, and then, a micro-lens layer is bonded to the OLED roll upon the roll-to-roll processing.

The roll-to-roll processing illustrated in FIGS. 19a and 19B implements the following processes:

First, a phosphor layer 210 and an OLED layer 220 are prepared. In this preparation process, the phosphor layer 210 and the OLED layer 220 are supplemented, distributed and transported by rollers. In addition, the preparation process may be applied for fabrication of each of the top emission OLED and the bottom emission OLED.

Next, the phosphor layer 210 and the OLED layer 220 pass through a pair of rollers 110 and 120 to be bonded to each other. In this case, the bonding is implemented by applying pressure and heat thereto through the pair of the rollers 110 and 120.

Upon the roll-to-roll processing, the adjustment of the thickness and the formation of the shape of the phosphor layer 210 are implemented by the blade 150. In this case, since the blade 150 is adjustable in height and may have various shapes, it is possible to form a patterned phosphor layer 210'.

Next, the OLED layer 220', to which the phosphor layer 210' is bonded, and a micro-lens layer 170 are prepared. In this preparation process, the OLED layer 220', to which the phosphor layer 210' is bonded, and the micro-lens layer 170 are supplemented, distributed and transported by the roller 160.

In addition, the micro-lens layer 170 is bonded to the OLED layer 220', to which the phosphor layer 210' is bonded, through the roller 160.

As a result, the OLED 220', to which the micro-lens layer 170 and the phosphor layer 210' are bonded, is obtained. This process for obtaining the OLED 220' may mean a final process or an intermediate completion process of the processing, and the obtained OLED is prepared on the roller.

FIGS. 20A, 20B, 21A and 21B illustrate processing for patterning the phosphor layer upon the roll-to-roll processing.

Figure 20A:
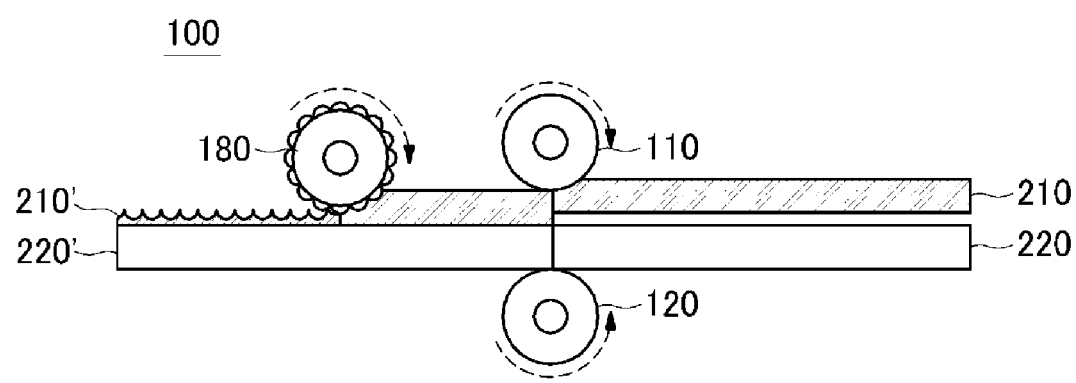
FIGS. 20A and 20B show a process for patterning a phosphor layer at the time of roll-to-roll processing.
Figure 20B:
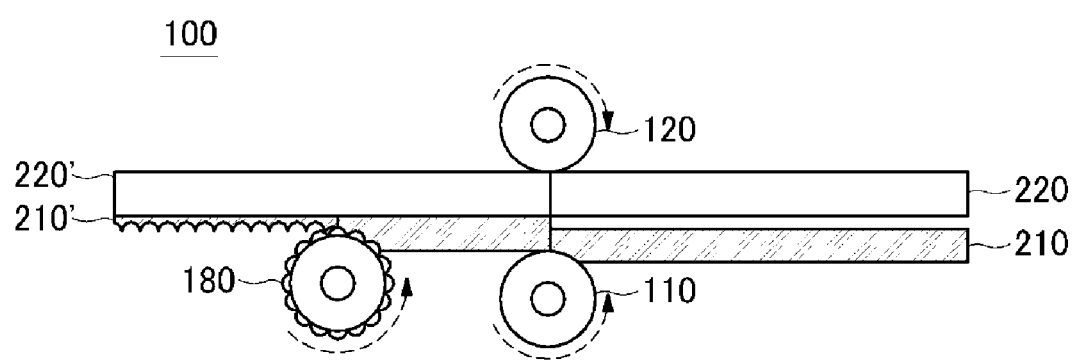

The roll-to-roll processing method illustrated in FIGS. 20A and 20B implements the following processes:

First, a phosphor layer 210 and an OLED layer 220 are prepared. In this preparation process, the phosphor layer 210 and the OLED layer 220 are supplemented, distributed and transported by the rollers 110 and 120. This roll-to-roll processing may be applied to fabrication of the top emission OLED and the bottom emission OLED.

Next, the phosphor layer 210 and the OLED layer 220 pass through the pair of the rollers 110 and 120 to be bonded to each other. At this time, the bonding is implemented by applying pressure and heat through the pair of the rollers 110 and 120.

Next, the phosphor layer 210' bonded to the OLED layer 220' is patterned by applying pressure and heat through a patterning roller 180. In this case, the patterning roller 180 is adjustable in height and can form the phosphor layer 210' patterned in various shapes.

As a result, the OLED 220', to which the patterned phosphor layer 210' is bonded, is obtained. This process for obtaining the OLED 220' may mean a final process or an intermediate completion process of the processing, and the obtained OLED 220' is prepared on the roller.

Figure 21A:
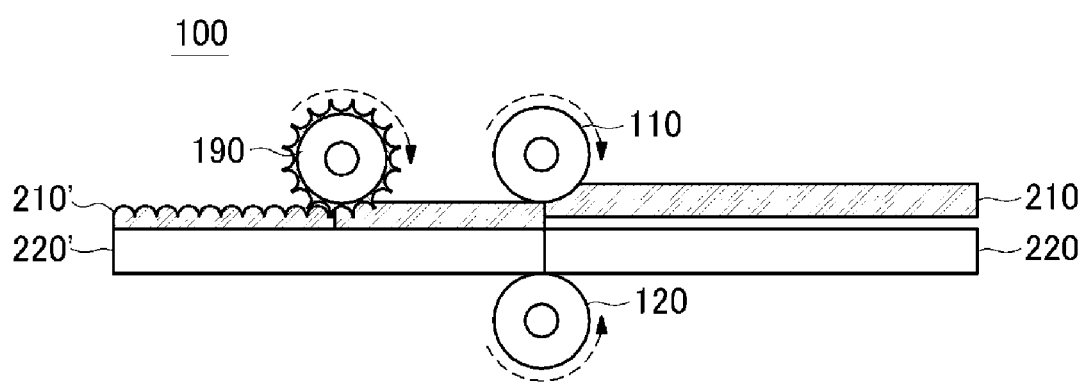
FIGS. 21A and 21B show a process for patterning a phosphor layer at the time of roll-to-roll processing.
Figure 21B:
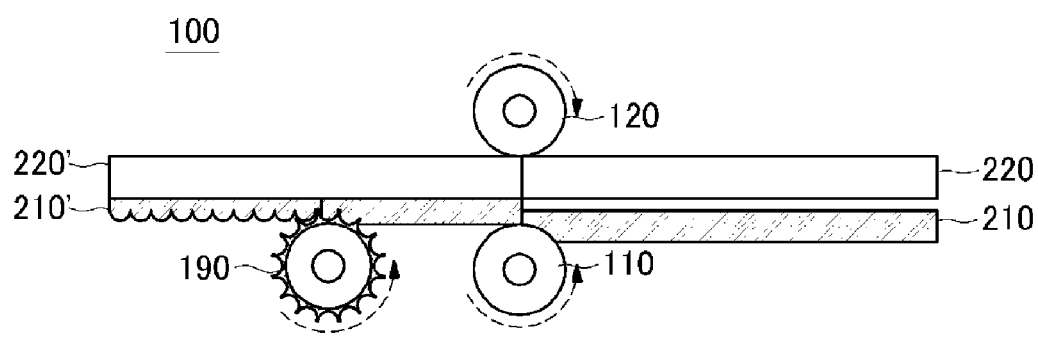

FIGS. 21A and 21B illustrate patterning the phosphor layer 210' by using a patterning roller 190, which is different in shape from the pattern roller 180 of FIG. 20.

FIGS. 22A, 22B, 23A and 23B illustrate pre/post-processes for the roll-to-roll processing.

FIGS. 22A, 22B, 23A and 23B show roll-to-roll processing, which further includes pre/post processing processes for the roll-to-roll processing, in addition to the roll function described with respect to the roll-to-roll processing in FIGS. 1 to 21B.

In the roll-to-roll processing and the pre/post processing processes for the roll-to-roll processing, it is possible to partition processes such as heating, drying, cooling, cooling and drying, flowing, vacuum suction collection, gas atmosphere control, UV irradiation, cutting, spray, organic/inorganic material injection and solution treatment, by adding a chamber (room or zone) function.

Figure 22A:
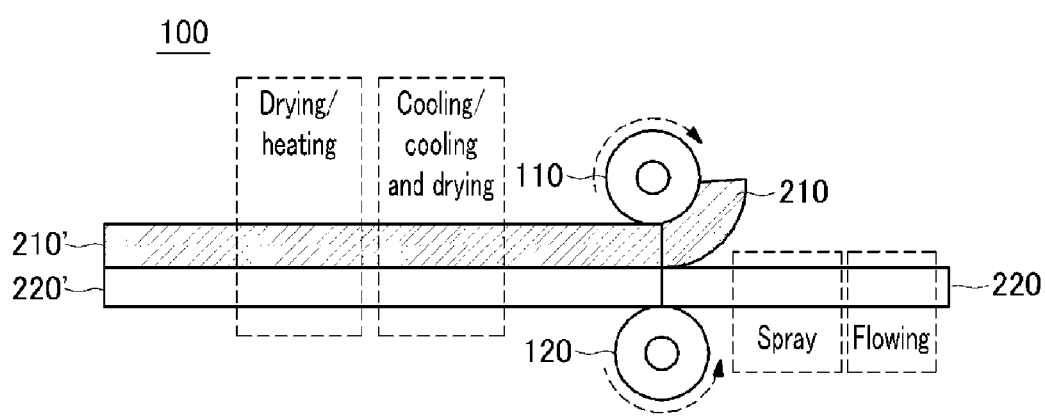
FIGS. 22A and 22B show processes prior to and after roll-to-roll processing.
Figure 22B:
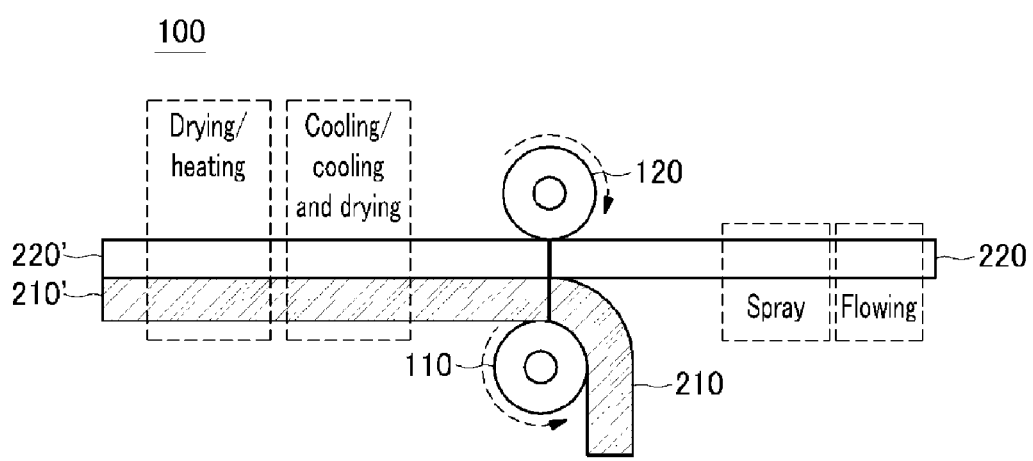

FIGS. 22A and 22B illustrate roll-to-roll processing, to which pre/post processing processes for fabricating a highly reliable/high quality OLED, to which a phosphor layer is bonded, are applied.

FIGS. 22A and 22B show roll-to-roll processing for fabricating the top emission OLED and the bottom emission OLED, respectively.

This roll-to-roll processing is implemented under an inert atmosphere and includes a flowing process for removal of fine dust, a spray process for uniformly providing materials such as an adhesive, a bond and a release agent, and cooling, heating and drying processes implemented after a bonding process.

Figure 23A:
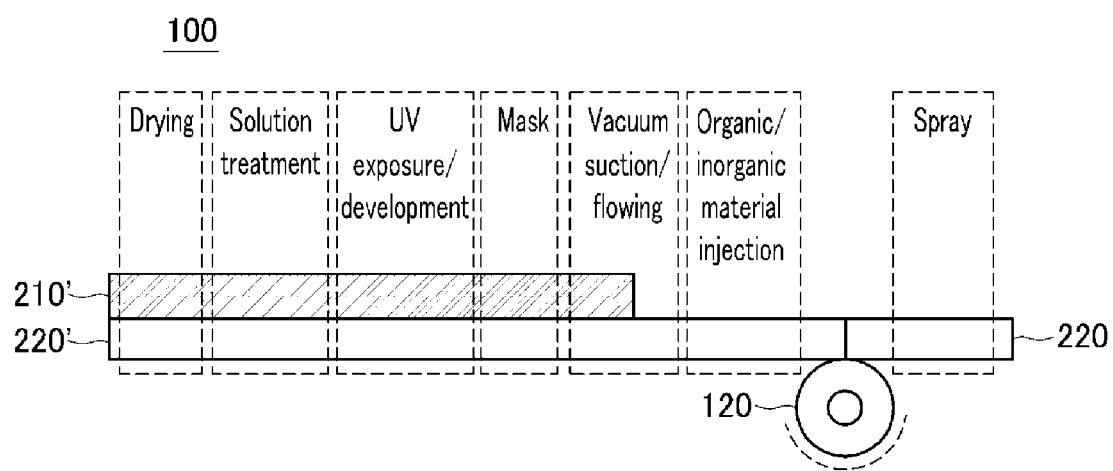
FIGS. 23A and 23B show processes prior to and after roll-to-roll processing.
Figure 23B:
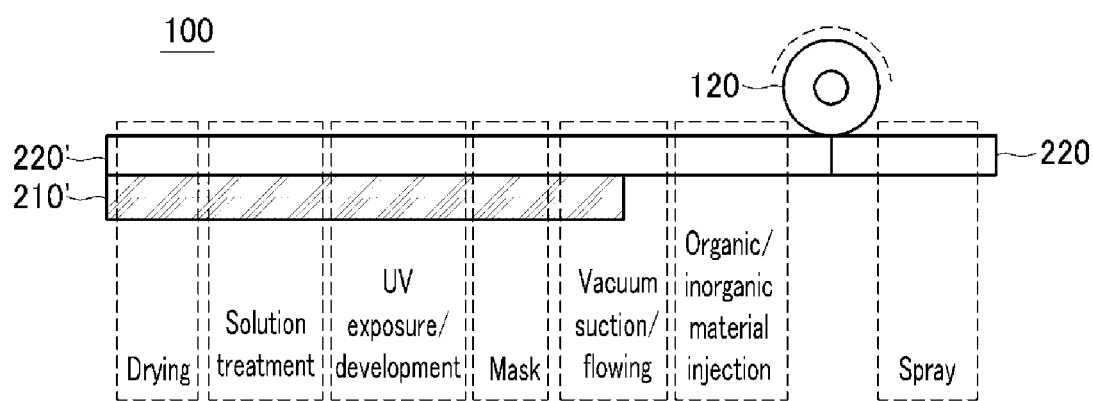

FIGS. 23A and 23B illustrate roll-to-roll processing, to which pre/post processing processes for patterning a highly reliable/high quality OLED, to which a phosphor layer is bonded, are applied.

FIGS. 23A and 23B show roll-to-roll processing for fabricating the top emission OLED and the bottom emission OLED, respectively.

The roll-to-roll processing is implemented under an inert atmosphere and includes a spray process for adhering an adhesive, an organic/inorganic material injection process for injection of a phosphor layer, a vacuum suction or flowing process, a mask process, a UV exposure or development process, a solution treatment process for removal of impurities, and a drying process.

For reference, the OLED fabrication through the roll-to-roll processing that has been described is based on a deposition process and has the goal to synthesize blue OLED. In order to improve the efficiency of the blue OLED, cavity may be adjusted, or a tandem structure may be used.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

EXPLANATION OF REFERENCE NUMERALS

100: roll-to-roll facility
110: first roller
120: second roller
210: first base material
220: second base material

What is claimed is:

1. A method for fabricating an organic light emitting device (OLED), comprising:
    bonding an OLED layer and an inorganic phosphor film to each other through roll-to-roll processing, wherein
    the inorganic phosphor film is provided as a color conversion layer,
    the inorganic phosphor film is an ultra-thin substrate having a stacking structure comprising an adhesive layer and an inorganic phosphor layer,
    the OLED layer is a top emission OLED having a stacking structure comprising a penetrative cathode layer, an organic light emitting layer and a reflective anode layer, and
    the adhesive layer of the inorganic phosphor film is bonded on the cathode layer of the top emission OLED.

2. A method for fabricating an organic light emitting device (OLED), comprising:
    bonding an OLED layer and an inorganic phosphor film to each other through roll-to-roll processing, wherein
    the inorganic phosphor film is provided as a color conversion layer,
    the inorganic phosphor film is an ultra-thin substrate having a stacking structure comprising an adhesive layer and an inorganic phosphor layer,
    the OLED layer is a bottom emission OLED having a stacking structure comprising a reflective cathode layer, an organic light emitting layer, and a penetrative anode layer, and
    the adhesive layer of the inorganic phosphor is bonded on the anode layer of the bottom emission OLED.

3. The method for fabricating an organic light emitting device of claim 2, wherein the inorganic phosphor film is produced in the manner that inorganic phosphor powders are contained in an ultra-thin vessel, and an adhesive is applied to the ultra-thin vessel.

4. The method for fabricating an organic light emitting device of claim 3, wherein the ultra-thin vessel is any one of ultra-thin transparent plastic or ultra-thin glass.

5. The method for fabricating an organic light emitting device of claim 2, further comprising providing the OLED layer and the inorganic phosphor film, which are in contact with each other on at least one surface of their respective surfaces, between a first roller and a second roller of roll-to-roll facility, prior to implementing the bonding through the roll-to-roll processing.

6. The method for fabricating an organic light emitting device of claim 2, further comprising providing the OLED layer and the inorganic phosphor film, which are in contact with each other on at least one surface of their respective surfaces, on a top or bottom portion of a single roller of roll-to-roll facility, prior to implementing the bonding through the roll-to-roll processing.

7. The method for fabricating an organic light emitting device of claim 2, further comprising providing the inorganic phosphor film in the state that it is wound around at least one roller of roll-to-roll facility, prior to implementing the bonding through the roll-to-roll processing.

8. The method for fabricating an organic light emitting device of claim 2, wherein the OLED layer is a blue OLED.

9. A method for fabricating an organic light emitting device (OLED), comprising:
   bonding an OLED layer and an inorganic phosphor film to each other through roll-to-roll processing, wherein
   the inorganic phosphor film is provided as a color conversion layer,
   the inorganic phosphor film has a stacking structure comprising an adhesive layer and an inorganic phosphor layer;
   the OLED layer has a stacking structure comprising a penetrative cathode layer, an organic light emitting layer and a reflective anode layer; and
   the bonding of the OLED layer and the inorganic phosphor film produces an OLED having a stacking structure in which the reflective anode layer, the organic light emitting layer, the penetrative cathode layer, the adhesive layer and the inorganic phosphor layer is stacked in that order.

10. A method for fabricating an organic light emitting device (OLED), comprising:
   bonding an OLED layer and an inorganic phosphor film to each other through roll-to-roll processing,
   wherein the inorganic phosphor film comprises an inorganic phosphor layer and an adhesive layer, and
   wherein the OLED layer comprises, in the following order:
      a barrier film layer contacting the adhesive layer,
      a transparent cathode layer,
      an electronic injection layer/electron transport layer,
      an organic light emitting layer
      a hole injection layer/hole transport layer,
      an anode layer, and
      a flexible substrate layer.

11. A method for fabricating an organic light emitting device (OLED), comprising:
   bonding an OLED layer and an inorganic phosphor film to each other through roll-to-roll processing,
   wherein the inorganic phosphor film comprises an inorganic phosphor layer and an adhesive layer, and
   wherein the OLED layer comprises, in the following order:
      a flexible substrate layer contacting the adhesive layer,
      an anode layer,
      a hole injection layer/hole transport layer,
      an organic light emitting layer,
      and electronic injection/electron transport layer,
      a reflective layer, and
      a barrier film layer.

12. The method for fabricating an organic light emitting device of claim 1, wherein the inorganic phosphor film is produced in the manner that inorganic phosphor powders are contained in an ultra-thin vessel, and an adhesive is applied to the ultra-thin vessel.

13. The method for fabricating an organic light emitting device of claim 12, wherein the ultra-thin vessel is any one of ultra-thin transparent plastic or ultra-thin glass.

14. The method for fabricating an organic light emitting device of claim 1, further comprising providing the OLED layer and the inorganic phosphor film, which are in contact with each other on at least one surface of their respective surfaces, between a first roller and a second roller of roll-to-roll facility, prior to implementing the bonding through the roll-to-roll processing.

15. The method for fabricating an organic light emitting device of claim 1, further comprising providing the OLED layer and the inorganic phosphor film, which are in contact with each other on at least one surface of their respective surfaces, on a top or bottom portion of a single roller of roll-to-roll facility, prior to implementing the bonding through the roll-to-roll processing.

16. The method for fabricating an organic light emitting device of claim 1, further comprising providing the inorganic phosphor film in the state that it is wound around at least one roller of roll-to-roll facility, prior to implementing the bonding through the roll-to-roll processing.

17. The method for fabricating an organic light emitting device of claim 1, wherein the OLED layer is a blue OLED.

* * * * *